United States Patent [19]

Doty

[11] 4,456,882
[45] Jun. 26, 1984

[54] HIGH SPEED CYLINDRICAL NUCLEAR MAGNETIC RESONANCE (NMR) SAMPLE SPINNER

[75] Inventor: Francis D. Doty, Columbia, S.C.

[73] Assignee: University of South Carolina, Columbia, S.C.

[21] Appl. No.: 336,627

[22] Filed: Jan. 4, 1982

[51] Int. Cl.³ .................................... G01R 33/08
[52] U.S. Cl. .............................. 324/321; 324/318
[58] Field of Search .............................. 324/318, 321

[56] References Cited

U.S. PATENT DOCUMENTS

| | | | |
|---|---|---|---|
| 2,960,649 | 11/1960 | Bloch | 324/321 |
| 3,588,677 | 6/1971 | Kleiman et al. | 324/321 |
| 3,681,683 | 8/1972 | Huber | 324/0.5 R |
| 4,088,944 | 5/1978 | Engler et al. | 324/0.5 AH |
| 4,201,941 | 5/1980 | Fyfe et al. | 324/321 |
| 4,254,373 | 3/1981 | Lippmaa et al. | 324/321 |
| 4,275,350 | 6/1981 | Hill | 324/321 |

OTHER PUBLICATIONS

Deuterium NMR in Solids with a Cylindrical Magic Angle Sample Spinner, R. Eckman, M. Alla, and A. Pines, May 13, 1980.
A Magic-Angle Rotor for NMR Using a Forced Gas Bearing Giovanni Balimann, Michael J. S. Burgess, Robin K. Harris, et al., Sep. 3, 1979.
A Magic-Angle Spinning System for Bullet-Type Rotors in Electromagnets, Victor J. Bartuska and Gary E. Maciel, Aug. 15, 1980.
High-Speed Rotors for Nuclear Magnetic Resonance Studies on Solids, E. R. Andrew, L. F. Farnell, M. Firth, T. D. Gledhill, and I. Roberts, Jul. 19, 1968.
A Variable-Temperature Probe for the Measurement of ¹H NMR Spectra with Magic-Angle Rotation, B. Schneider, D. Doskocilova, J. Babka, and Z. Ruzicka, Mar. 12, 1979.
A High Speed Spinner for Magic Angle Spinning NMR, P. A. S. van Dijk, W. Schut, J. W. M. van Os, E. M. Menger, and W. S. Veeman, Jun. 9, 1980.

Primary Examiner—Michael J. Tokar
Attorney, Agent, or Firm—Brumbaugh, Graves, Donohue & Raymond

[57] ABSTRACT

A high speed cylindrical nuclear magnetic resonance (NMR) sample spinner includes a housing to which pressurized air is supplied. A cylindrical stator is mounted within the housing and is adapted to support a receiver coil. There are spaced along the length of the stator a number of circumferentially spaced openings through which the pressurized air is transmitted from the housing to the interior of the stator. A solid to be analyzed by nuclear magnetic resonance is placed within a rotor and the rotor is inserted into the stator. The rotor is supported within the stator by the pressurized air transmitted through one or more of the openings formed in the stator. The rotor is driven by a turbine-shaped end cap which is responsive to the air supplied through other of the openings formed in the stator.

11 Claims, 4 Drawing Figures

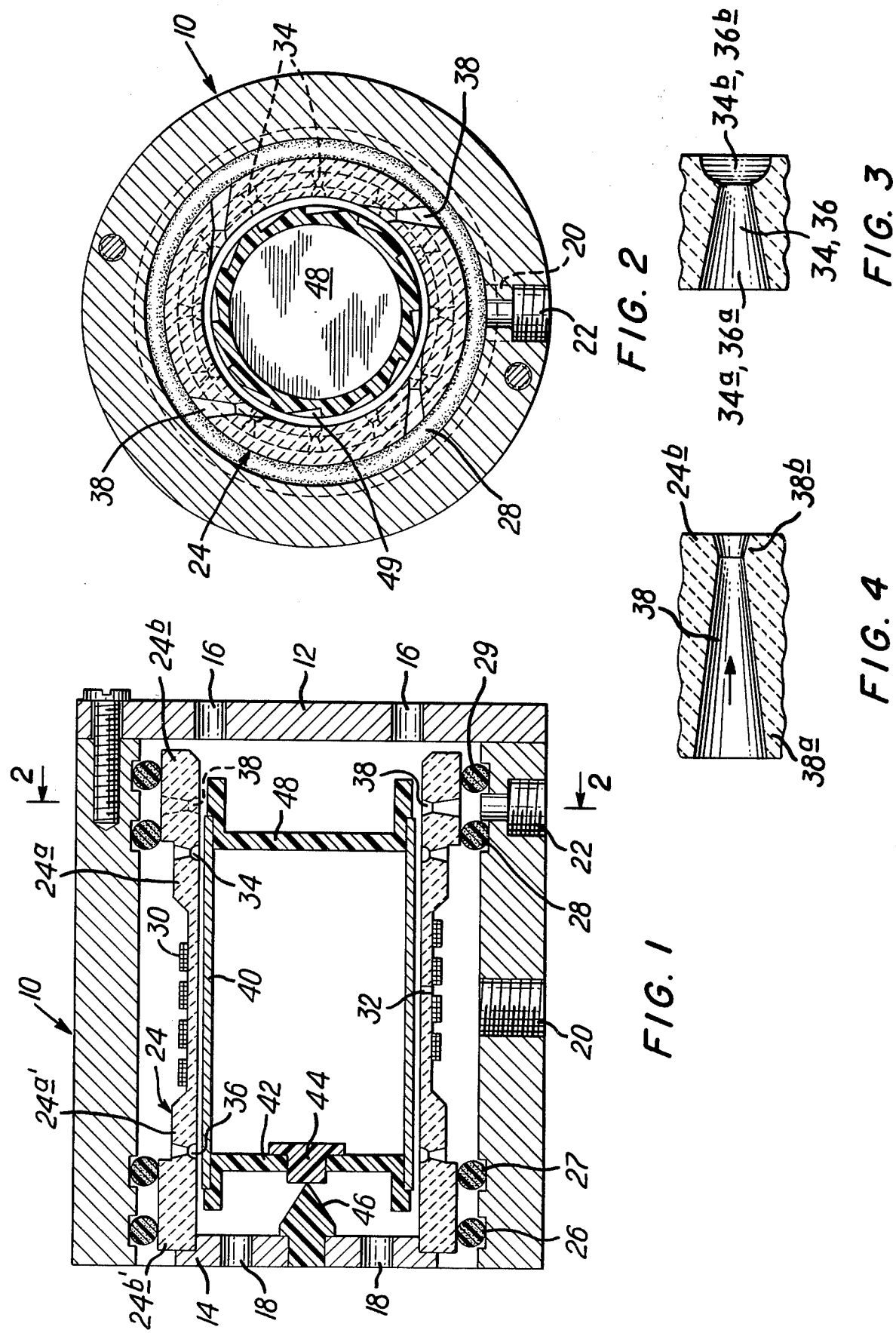

HIGH SPEED CYLINDRICAL NUCLEAR MAGNETIC RESONANCE (NMR) SAMPLE SPINNER

BACKGROUND OF THE INVENTION

This invention was made with Government support under grant number CHE-78-18723, awarded by the National Science Foundation. The Government has certain rights in this invention.

The invention relates to nuclear magnetic resonance (NMR) spinners and, more particularly, to a new and improved high speed cylindrical NMR spinner useful in the study of solids.

Generally, two types of high speed spinners have been used for studying the nuclear magnetic resonance of solids. The first type employs a single conical surface for both the bearing and the drive system. It is easy to construct and operate this type spinner, but the rotor of the spinner is not readily stabilized, especially when testing non-uniform samples at high speeds.

The second type spinner employs separate bearing and drive systems. Such spinners include a design where the rotor spins on small nylon axles. This design is satisfactory only for solid rotors where the balance and concentricity can be maintained to a very high tolerance. Another design includes bearings which are lubricated by oil. This design is generally unsatisfactory because a high flow rate of low viscosity oil is required to prevent excessive heat buildup at the bearing surface. A third design, and the type design with which this invention is generally concerned, utilizes rotors which spin on air bearings. A description of a typical design appears in the Journal of Magnetic Resonance, 42, 440 1980, by Messrs. Eckman, Alla and Pines. Until this invention, spinners including air bearings have suffered from a lack of rotor stability and drive efficiency.

SUMMARY OF THE INVENTION

It is an object of the present invention to make a high speed NMR spinner for use in the study of solids in which the rotor is supported by air bearings and is characterized by improved rotor stability.

It is a further object of the present invention to provide a high speed NMR spinner in which the rotor is supported by air bearings and is characterized by improved drive efficiency.

It is a further object of the present invention to provide a high speed NMR spinner which is capable of operating over a wide range of temperatures.

These and other objects of the present invention are accomplished by a high speed cylindrical nuclear magnetic resonance sample spinner which comprises a housing for distributing a fluid or fluids under pressure, a stator resiliently mounted within the housing for receiving a nuclear magnetic resonance receiver coil and including means for transmitting the pressurized fluid to at least two locations within the stator, and a rotor supported within the stator by fluid supplied to at least one of the locations within the stator and including drive means responsive to fluid supplied to another of the locations within the stator for causing the rotation of the rotor within the stator.

Preferably, the fluid is air, but gases, such as nitrogen or helium, may be used to support and drive the rotor.

BRIEF DESCRIPTION OF THE DRAWINGS

In the drawings:

FIG. 1 is a cross-sectional side view of a high speed cylindrical nuclear magnetic resonance spinner arranged according to the present invention;

FIG. 2 is cross-sectional view of the FIG. 1 embodiment taken along Lines 2—2 of FIG. 1 and looking in the direction of the arrows;

FIG. 3 is an enlarged cross-sectional view of one of the air bearing orifices formed in the stator forming a part of FIG. 1; and FIG. 4 is an enlarged cross-sectional view of one of the air jets formed in the stator forming a part of the FIG. 1 embodiment of the present invention.

DETAILED DESCRIPTION OF PREFERRED EMBODIMENTS

The preferred embodiment of a nuclear magnetic resonance sample spinner arranged according to the present invention, as shown in FIGS. 1 and 2, comprises a cylindrical housing 10 which is closed at its open ends by a pair of end plates 12 and 14. A plurality of holes 16 and 18 are formed in the end plates 12 and 14, respectively, and serve the function of exhausting air present in the housing to the atmosphere. The housing 10 includes openings 20 and 22 to which fluid, e.g. air or gas, under pressure, e.g. two to five atmospheres, is supplied by means such as air hoses arranged with the appropriate fittings.

A stator 24 is supported within the housing 10 by O rings 26, 27, 28 and 29. Preferably, the O rings are made from either unfilled Viton (a fluorocarbon) or a silicone rubber, but other elastomers may also be used. Viton is generally preferred except for very low or very high temperature operation, in which cases silicone rubbers are preferred. It will be observed that the O ring 28 is mounted between the openings 20 and 22 and therefore separates the pressurized air supplied to the housing 10 through those respective openings. The separate lines facilitate spinning by the rotor above vibrational instabilities. Further, variable temperature experiments are simplified because only the bearing air need be cooled or heated. This allows high speed spinning at low temperatures without the use of a helium drive gas.

The stator 24 has a generally uniform and thin-walled construction, expanding at its ends into thick-walled sections 24a and 24a' and even thicker-walled terminal sections 24b and 24b'. The stator may be formed of aluminum oxide or silicon nitride. If the stator 24 is ground from a high strength, high modulus ceramic, the wall thickness at the center of the stator can be reduced to about 4% of the diameter of the stator.

Mounted around the center of the stator 24 is a nuclear magnetic resonance receiver coil 30. For optimum sensitivity, the length of the coil 30 should be about one and one-half times the diameter of the stator at its midsection. The coil 30 is cemented in place by a refractory cement. The cementing of the coil 30 onto the stator reduces spurious effects that might otherwise be caused by coil vibration, imparts some additional strength, rigidity and mass to the stator 24 and permits higher radio frequency pulse power.

Four circumferentially spaced holes 32 are formed in the center of the stator 24. The holes 32 are provided to cool the rotor (described hereinafter) mounted within the stator. The holes 32 provide sufficient air flow to keep the temperature rise within the stator to below 5°

Centigrade and facilitate variable temperature experiments.

There are formed in the thick-walled sections 24a and 24a' of the stator 24 a plurality of circumferentially-spaced air bearing holes 34 and 36, respectively. In the preferred embodiment of this invention, each thick-walled section contains twelve equally bearing holes and an air pocket at the interior surface of the stator 24. The preferred configuration for the pocketed air bearing holes is shown in FIG. 3. Each hole, 34 and 36, is of a generally circular cross-section throughout most of its length, and includes a section 34a or 36a which tapers from a larger to a smaller diameter from the exterior toward the interior surface of the stator. A shallow recess or pocket, 34b or 36b, generally of elliptical, circular, or rectangular cross-section, is provided on the interior surface of the stator. The pocket functions to maintain subsonic flow about its periphery in the clearance space between the rotor and stator. This results in increased stiffness of the air bearing and thereby raises the resonant frequencies of the rotor.

The thick-walled section 24b of the stator 24 has formed therein four circumferentially-spaced holes or air jets 38. The preferred configuration of the air jets 38 is shown in FIG. 4. As shown there, the holes are formed with relatively long and relatively short frusto-conical sections 38 a and 38b, respectively, each having a taper angle of about 15°. The flared sections 38b functions to reduce the potential for choking and shock resulting from the passage of air at supersonic speeds through the air jets. The air jets 38 are arranged so as to transmit the air tangentially into the interior of the stator.

Mounted within the stator 24 is a cylindrical rotor 40 preferably made of either aluminum oxide or silicon nitride. The solid to be tested for its nuclear magnetic resonance is packed into the rotor. In a 12 millimeter rotor made from aluminum oxide, the wall thickness may be about 0.7 millimeter. In a rotor made from silicon nitride, the wall thickness may be about 0.5 millimeter. The radial clearance between the stator 24 and the rotor 40 must be very small to achieve vibrational frequencies which are greater than the spinning frequency of the rotor 40. For a 12 millimeter rotor having a surface speed of 0.5 c or one-half the speed of sound, the applicant has found that the radial clearance should be no greater than 0.025 millimeter.

The rotor 40 is closed at the end adjacent the end plate 14 by a rotor end cap 42. Mounted centrally within the rotor end cap 42 is a button 44 made of a wear resistant material such as a graphite filled polyimide or aluminum oxide or silicon nitride. The center of the button 44 is aligned with and engages the tip of a conically-shaped bearing 46 mounted within the stator end plate 14. The bearing 46 maintains the axial positioning of the rotor 40 within the stator.

The opposite end of the rotor 40 is closed by a rotor drive end cap 48 which has the form of an impulse turbine. Thus, the end cap includes blades which result from the formation in the periphery of the end cap of twelve circumferentially-spaced cutouts or buckets 49. The blades of the end cap are aligned with the air jets 38 formed in the thick-walled section 24b of the stator 24. As formed, the cutouts 40 deflect the air impacting upon the end cap from the air jets 38. Thus, as formed, they add reaction drive for improved performance at high speeds. The applicant has found that the optimum depth of the cutouts formed in the end cap 48 is about 0.9 times the diameter of the flared sections 38b of the openings 38.

In operation, air having a pressure of about four atmospheres is supplied separately through openings 20 and 22 to the housing 10. From the opening 20, the pressurized air passes through the air bearing holes 34 and 36 and into the interior of the stator 24. The rotor 40 is supported within the stator 24 by such pressurized air.

The pressurized air passing through the opening 22 is supplied to the blades of the rotor drive end cap 48 to drive the end cap in a circular direction. In turn, the rotor is rotated by the end cap 48, with the speed of rotation increasing gradually to the desired spinning frequency, typically four kiloHertz. Various types of nuclear magnetic resonance experiments may then be performed, including novel experiments involving variable temperatures and variable spinning frequencies.

With the design shown in FIGS. 1-4, the radial clearance between the stator 24 and the rotor 40 is kept small and the air bearings 34 have a load capacity great enough to support the asymmetrical force required to constrain the rotor 40 to rotate about its geometric axis. Additionally, the spinning frequency will often be smaller than the resonant vibrational frequencies of the rotor 40.

Optimum performance depends critically on the proper values of various parameters. An approximate isothermal analysis of the fluid flow system has determined that the most critical parameter is the radial clearance, $r_c$, between the rotor 40 and the stator 24. The optimum value is given by the following equation in cgs units:

$$r_c = (7000 \mu^2 r_2 / c^2 \rho^2)^{\frac{1}{4}}$$

where $\mu$ is the dynamic viscosity of the fluid, e.g. air or gas, $r_2$ is the rotor radius, c is the velocity of sound under the prevailing conditions in the air bearing and $\rho$ is the mean density of the gas in the air bearing.

The air bearing holes 34 and 36 are located near the ends of the rotor 40 to increase the conical mode resonant frequencies. The optimum distance, $l_1$, between the center of the holes and the ends of the rotor 40 is $$l_1 = r_1 + \pi r_2 / n$$

where $r_1$ is the mean radius of the pocket and n is the number of air bearing holes at each end.

The optimum radius, $r_o$, of each air bearing hole 34, 36 at the point of minimum cross-section is $$r_o = (2.8 \, r_c^3 / c)^{\frac{1}{2}} \times 10^4 \, \text{sec}^{-\frac{1}{2}}.$$

The optimum mean radius, $r_1$, of the pockets 34b, 36b, in the plane of the interior surface of the stator 24 is $$r_1 = \tfrac{2}{3} \, r_o^2 / r_c.$$

The optimum depth, h, of the pocket is $$h = \tfrac{2}{3} \, r_o.$$

The optimum wall thickness, w, of the rotor 40 ranges from $0.08 r_2$ to $0.11 r_2$ as the sample density ranges from 0.25 to 1.0 times the density of the rotor materials for the typical case of small nuclear magnetic resonance anisotropies. For the less common case of large nuclear magnetic resonance anisotropies, the optimum wall thickness ranges from $0.12 r_2$ to $0.19 r_2$ as the sample density ranges from 0.25 to 1.0 times the density of the rotor material.

Table I illustrates some typical recommendations when air is used as the bearing fluid. All dimensions are in centimeters.

TABLE I

| $r_2$ | $r_c$ | $r_o$ | $r_1$ | w |
|---|---|---|---|---|
| .25 | .0021 | .011 | .023 | .02–.05 |
| .4 | .0024 | .013 | .030 | .032–.08 |
| .6 | .0027 | .016 | .038 | .05–.12 |

Although the applicant's invention has been described herein with reference to a specific embodiment, it will be apparent that changes and modifications can be made thereto without changing the inventive contribution made by the applicant. As an example, in order to maintain the axial positioning of the rotor within the stator, the bearing 46 may be replaced by a hydrostatic thrust bearing. The hydrostatic thrust bearing can be formed by mounting a collar on the interior surface of the terminal section 24b of the stator adjacent the axially extending wall of the end cap 42. The bearing air which is forced between the end cap 42 and the collar maintains the axial positioning of the rotor. The scope of the invention is to be measured by the following claims.

I claim:

1. A high speed cylindrical nuclear magnetic resonance sample spinner comprising a housing for distributing gas under pressure, a stator mounted within the housing for receiving a nuclear magnetic resonance receiver coil and including axially spaced first and second pluralities of circumferentially spaced gas bearing holes formed near the ends of the stator for transmitting the pressurized gas to at least two locations within the stator, each gas bearing hole terminating in an expanded opening at the interior surface of the stator to maintain subsonic flow at the interior surface of the stator, and a further plurality of circumferentially-spaced holes in the form of drive jets located at one end of the stator for transmitting the pressurized gas to a third location within the stator and a rotor supported within the stator by the gas transmitted by the first and second pluralities of gas bearing holes, and including drive means responsive to the gas transmitted by the drive jets for causing the rotation of the rotor within the stator.

2. A high speed cylindrical nuclear magnetic resonance sample spinner according to claim 1, wherein air is the fluid distributed under pressure and employed to support and drive the rotor within the stator, and wherein the rotor is mounted cylindrically within the stator and separated radially therefrom by a small distance.

3. A high speed cylindrical nuclear magnetic resonance sample spinner according to claim 2 wherein the drive means of the rotor comprises an end cap in the form of a cylindrically-shaped turbine having its blades aligned with the drive jets formed in the stator and being partially hollow from its exterior end.

4. A high speed cylindrical nuclear magnetic resonance sample spinner according to claim 3, wherein each of the drive jets formed in the stator is in the form of two frusto-conical sections of unequal length joined together at their smaller ends, the shorter of the frusto-conical sections being formed on the stator on the side adjacent to the rotor.

5. A high speed cylindrical nuclear magnetic resonance sample spinner according to claim 3, wherein the openings formed in the stator for supporting the rotor within the stator are in the form of two sections of unequal length and generally frusto-conical cross sections joined together at their smaller ends, the shorter of the generally frusto-conical sections being formed in the stator on the side adjacent to the rotor.

6. A high speed cylindrical nuclear magnetic resonance sample spinner according to claim 3, wherein there are formed in the stator midway between the axially spaced first and second pluralities of circumferentially spaced holes still further circumferentially spaced holes which function as cooling air holes.

7. A high speed cylindrical nuclear magnetic resonance sample spinner according to claim 1 further comprising O rings mounted within the housing for resiliently supporting the stator.

8. A high speed cylindrical nuclear magnetic resonance sample spinner according to claim 1, including means for positioning the rotor axially within the stator, said means comprises a conically shaped bearing mounted at one end of the stator for engaging the rotor at the axis thereof.

9. A high speed cylindrical nuclear magnetic resonance spinner according to claim 3, wherein the ratio of the axial length to the diameter of the receiver coil is about 1.5.

10. A high speed cylindrical nuclear magnetic resonance sample spinner according to claim 3, wherein the rotor is made from a high-strength ceramic material.

11. A high speed cylindrical nuclear magnetic resonance sample spinner according to claim 10, wherein the high-strength ceramic material is selected from the group consisting of aluminum oxide and silicon nitride.

* * * * *